US010644302B2

(12) United States Patent
Gielis et al.

(10) Patent No.: US 10,644,302 B2
(45) Date of Patent: May 5, 2020

(54) CONFORMAL COATING ON THREE-DIMENSIONAL SUBSTRATES (71) Applicants: IMEC VZW, Leuven (BE); Universiteit Hasselt, Hasselt (BE)

(72) Inventors: Sven Gielis, Turnhout (BE); An Hardy, Heusden-Zolder (BE); Marlies Van Bael, Molenbeek-Wersbeek (BE); Philippe M. Vereecken, Liege (BE)

(73) Assignees: IMEC VZW, Leuven (BE); Universiteit Hasselt, Hasselt (BE)

( * ) Notice: Subject to any disclaimer, the term of this patent is extended or adjusted under 35 U.S.C. 154(b) by 316 days.

(21) Appl. No.: 15/312,176

(22) PCT Filed: May 20, 2015

(86) PCT No.: PCT/EP2015/061133
§ 371 (c)(1),
(2) Date: Nov. 17, 2016

(87) PCT Pub. No.: WO2015/177221
PCT Pub. Date: Nov. 26, 2015

(65) Prior Publication Data
US 2017/0092931 A1 Mar. 30, 2017

(30) Foreign Application Priority Data
May 21, 2014 (EP) .................................... 14169181

(51) Int. Cl.
*H01M 4/04* (2006.01)
*H01M 4/139* (2010.01)
(Continued)

(52) U.S. Cl.
CPC ............ *H01M 4/0419* (2013.01); *B05D 1/02* (2013.01); *B05D 3/044* (2013.01); *C23C 18/04* (2013.01);
(Continued)

(58) Field of Classification Search
CPC ............................ H01M 4/0419; B05D 3/044
See application file for complete search history.

(56) References Cited

U.S. PATENT DOCUMENTS 5,238,877 A 8/1993 Russell
6,770,257 B1 * 8/2004 Imura .................... B01J 21/063
423/610

(Continued)

OTHER PUBLICATIONS

Vaiciulis et al., "On Titanium Oxide Spray Deposited Thin Films for Solar Cells Applications," 2012, Proceedings of the Romanian Academy, Series A, vol. 13, No. Apr. 2012, pp. 335-342. (Year: 2012).*

(Continued)

*Primary Examiner* — Robert A Vetere
(74) *Attorney, Agent, or Firm* — McDonnell Boehnen Hulbert & Berghoff LLP (57) ABSTRACT The disclosure relates to a method for forming a conformal coating on a substrate having a topography presenting a relief. One method of the disclosure includes setting the temperature of the substrate within the range 140-275° C., and coating an aqueous solution including a sol-gel precursor on said substrate. The disclosure also relates to a method for fabricating a battery, a capacitor, a catalyst, a photovoltaic cell or a sensor using such a method, and to an aqueous solution for use in such a method.

22 Claims, 8 Drawing Sheets (51) Int. Cl.
*C23C 18/04* (2006.01)
*C23C 18/12* (2006.01)
*B05D 1/02* (2006.01)
*B05D 3/04* (2006.01)
*H01G 9/042* (2006.01)
*H01L 31/0216* (2014.01)
*H01M 4/131* (2010.01)
*H01M 4/1391* (2010.01)
*H01M 4/525* (2010.01)
*H01M 10/0525* (2010.01)
*H01M 10/0585* (2010.01)
*H01M 10/052* (2010.01)
*H01M 10/058* (2010.01)

(52) U.S. Cl.
CPC ...... *C23C 18/1216* (2013.01); *C23C 18/1245* (2013.01); *C23C 18/1254* (2013.01); *C23C 18/1291* (2013.01); *H01G 9/042* (2013.01); *H01L 31/02167* (2013.01); *H01M 4/0471* (2013.01); *H01M 4/131* (2013.01); *H01M 4/139* (2013.01); *H01M 4/1391* (2013.01); *H01M 4/525* (2013.01); *H01M 10/0525* (2013.01); *H01M 10/0585* (2013.01); *H01M 10/052* (2013.01); *H01M 10/058* (2013.01); *Y02E 60/122* (2013.01)

(56) References Cited

U.S. PATENT DOCUMENTS

| | | | | |
|---|---|---|---|---|
| 2002/0038664 | A1* | 4/2002 | Zenko | B32B 17/10743 136/251 |
| 2002/0127455 | A1* | 9/2002 | Pham | H01M 4/9033 429/430 |
| 2004/0087068 | A1* | 5/2004 | Yudasaka | C23C 18/08 438/149 |
| 2006/0189690 | A1* | 8/2006 | Dunham | A01N 37/44 514/538 |
| 2008/0292790 | A1 | 11/2008 | Lebrette et al. | |
| 2009/0297626 | A1* | 12/2009 | O'Brien | A61K 33/24 424/642 |
| 2010/0135937 | A1* | 6/2010 | O'Brien | A61K 8/02 424/59 |
| 2010/0186805 | A1 | 7/2010 | Krunks et al. | |
| 2012/0098032 | A1* | 4/2012 | Guo | H01L 21/02568 257/184 |
| 2012/0225250 | A1* | 9/2012 | Kuznetsov | C23C 18/08 428/156 |
| 2013/0032853 | A1* | 2/2013 | Kawata | C08L 83/04 257/100 |
| 2013/0108802 | A1 | 5/2013 | Oladeji | |
| 2013/0168347 | A1 | 7/2013 | Gevorgian | |
| 2013/0260047 | A1 | 10/2013 | Bamola | |
| 2014/0251666 | A1* | 9/2014 | Arai | C23C 18/1216 174/257 |

OTHER PUBLICATIONS

PCT International Search Report and Written Opinion, PCT International Application No. PCT/EP2015/061133, dated Sep. 7, 2015, 13 pages.
Shaijumon, Manikoth M. et al., "Nanoarchitectured 3D Cathodes for Li-Ion Microbatteries", Advanced Materials, vol. 22, No. 44, Nov. 24, 2010, pp. 4978-4981.
Oltean, Gabriel et al., "On the Electrophoretic and Sol-Gel Deposition of Active Materials on Aluminium Rod Current Collectors for Three-Dimensional Li-Ion Micro-Batteries", Thin Solid Films, vol. 562, Mar. 28, 2014, pp. 63-69.
Xia, Deying et al., "Titania Nanostructure Arrays from Lithographically Defined Templates", Applied Physics Letters, vol. 97, No. 22, Dec. 2010, pp. 223106-1-223106-3.
Vaiciulis, Ignas et al., "On Titanium Oxide Spray Deposited Thin Films for Solar Cells Applications", Proceedings of the Romanian Academy, Series A, vol. 13, No. 4/2012, pp. 335-342.
Vorotilov, K.A. et al., "Effect of Processing Temperature During Spin-On Application on the Properties of Sol-Gel Silica Films", Journal of Sol-Gel Science and Technology, vol. 2, Nos. 1/2/3, Jan. 1994, pp. 559-562.
Damian, M.A. et al., "Characterization and Butanol/Ethanol Sensing Properties of Mixed Tungsten Oxide and Copper Tungstate Films Obtained by Spray-Sol-Gel", Thin Solid Films, vol. 444, No. 1-2, Nov. 2003, pp. 104-110.
Senadeera, G K R et al., "Versatile Preparation Method for Mesoporous TiO2 Electrodes Suitable for Solid-State Dye Sensitized Photocells", Bull. Mater. Sci., vol. 28, No. 6, Oct. 2005, pp. 635-641.
Liu X.M. et al., "Characteristics of Nano Ti-Doped SnO2 Powders Prepared by Sol-Gel Method", Materials Science and Engineering, vol. 426, No. 1-2, Jun. 25, 2006, pp. 274-277.
Zhang, Chunming et al., "Li4Ti5O12 Preapred by a Modified Citric Acid Sol-Gel Method for Lithium-Ion Battery", Journal of Power Sources, vol. 236, Jan. 28, 2013, pp. 118-125.
Seyedahmadian, Masoud et al., "Synthesis and Characterization of Nanosized of Spinel LiMn2O4 Via Sol-Gel and Freeze Drying Methods", Bull. Korean Chem. Soc., vol. 34, No. 2, Feb. 20, 2013, pp. 622-628.

* cited by examiner

CONFORMAL COATING ON THREE-DIMENSIONAL SUBSTRATES

CROSS-REFERENCE TO RELATED APPLICATIONS

The present application is a United States national stage filing under 35 U.S.C. 371 of International Patent Application no. PCT/EP2015/061133, filed May 20, 2015, which claims the benefit of priority of European Patent Application no. 14169181.6, filed May 21, 2014.

TECHNICAL FIELD OF THE INVENTION

The present invention relates to the field of conformal coating of three-dimensional substrates, especially those presenting a relief with high aspect-ratio elements. More in particular, it relates to the formation of thin film Li-ion batteries or 3D thin film Li-ion batteries and to the manufacture of dielectric films for capacitors, catalysts, photovoltaic cells and sensors via such conformal coatings. It also relates to an aqueous solution for such coatings.

BACKGROUND OF THE INVENTION

Conformal coverage of high surface area three-dimensional substrates is typically done by vacuum based techniques like chemical vapor deposition (CVD) and atomic layer deposition (ALD). In spite of their many advantages, these deposition methods also have some drawbacks such as high running and equipment costs, complex set-up, and low throughput due to a tremendous increase in deposition time as the surface area of the substrates increases. For commercial applications there is a strong need to overcome these disadvantages. This could be found in wet chemical routes which are characterized by their operational simplicity and concurrent low cost.

Niesen et al. (J. Electroceram. 6, p.169, 2001) disclose a wet chemical approach allowing deposition of ultrathin $TiO_2$ layers on planar substrates via chemical solution deposition (CSD). This approach is however not particularly suitable for the conformal coating of substrates presenting a relief.

Shaijumon et al. (Adv. Mater. 2010, 22, 4978-4981) disclose the design and making of nanoarchitectured 3D positive electrode for lithium ion microbattery applications. This involved the thermal decomposition of Pechini-like sol-gel $LiCoO_2$ precursors evenly spray-coated onto 3D Al nanorod current collectors directly grown on an Al substrate. For the preparation of the nanostructured $LiCoO_2$, an aqueous solution of Lithium salts, Cobalt salts, ethylene glycol and citric acid was prepared to form a transparent sol and this sol was spray coated onto the Al nanorods, followed by drying in air at 60° C. for 1 hour. The function of ethylene glycol was to form ester cross-linkages. The substrate was rinsed and heated at 650° C. for 8 h in air. The process of spray-coating and annealing was repeated 2 to 5 times to obtain the wanted $LiCoO_2$ coating thickness. The nanorods were however not completely covered. Moreover, the method of Shaijumon et al. involved three spray-coating and annealing steps, totalling a process time of from 27 to 30 hours, resulting in a thickness of only 30 nm.

There is therefore still a need in the art for conformal coating processes at least partly overcoming the above drawbacks.

SUMMARY OF THE INVENTION

It is an object of the present invention to provide good methods and solutions for rapidly obtaining a conformal coverage of a substrate having a relief. In embodiments, this remains true even for relief having an aspect ratio of 10 or more, or even 15 or more.

It is an advantage of embodiments of the present invention that substrates having a relief can be conformally coated, i.e. coated with a coating having a uniform thickness and exactly following the topography of the underlying substrate. In other words, the thickness of the coating is substantially the same on the relief structures and in the recesses between such structures as well as on the sides of such relief structures. In embodiments, the thickness uniformity of the coating may be characterized by a relative standard deviation of less than 15%, preferably less than 5%, preferably less than 2%, most preferably less than 1% and the most preferably less than 0.5%. Conformality permits to have a uniform current distribution. The thickness of the coating is measured by scanning electron microscopy having a back-scattered electrons detector (SEM (BSE)).

It is an advantage of embodiments of the present invention that substrates having a relief can be rapidly coated. For instance, a ca. 150 nm conformal layer could be obtained in only 1.25 hours, compared to a 30 nm layer obtained in 27-30 hours by Shaijumon et al.

It is an advantage of embodiments of the present invention that it can provide a conformal coating on a substrate having a relief via operationally simple methods.

It is an advantage of embodiments of the present invention that it can provide a conformal coating on a substrate having a relief via relatively inexpensive methods.

It is an advantage of embodiments of the present invention that they are environment-friendly because they are water-based.

It is an advantage of embodiments of the present invention that they can provide a conformal coating on a large variety of substrates. The substrate can be conductive, semi-conductive or non-conductive. In certain aspects, the method and aqueous solution of the present invention are not very sensitive to the chemical nature of the substrate. Embodiments of the present invention are therefore particularly versatile.

It is an advantage of embodiments of the present invention that they permit the deposition of both, mono-metal oxides and multi-metal oxides. This is an additional reason why embodiments of the present invention can be particularly versatile.

It is an advantage of embodiments of the present invention that substrates having a relief can be coated with a well crystallised metal oxide layer. For instance, in embodiments, phase-pure $TiO_2$ anatase films, $Li_4Ti_5O_{12}$ spinel films, $Li_{3x}La_{(2/3)-x}TiO_3$ (with $0.06 \leq x \leq 0.14$, preferably with x=0.117) films, LixWO3 with $0 \leq x \leq 1$, preferably $LiWO_3$, films, phase-pure hexagonal $LuFeO_3$ films, or phase-pure orthorhombic $LuFeO_3$ films could be obtained.

Methods and aqueous solutions developed as embodiments of the present invention proved particularly well suited to the manufacture of electrode and electrolyte films for thin-film batteries such as Li-ion thin-film batteries or 3D thin film Li-ion batteries, and to the manufacture of dielectric films for capacitors, catalysts, photovoltaic cells and sensors. Solid-state batteries have various advantages over traditional Li-ion batteries based on powders for the active electrode and on a liquid for the electrolyte. For instance, they may show one or more of the following advantages:

a lower risk of shorts, thermal runaway and explosions,
a lighter weight and a smaller volume due to a smaller casing and the absence of membrane separators, a higher performance stability with each charge/discharge due to their dry nature and therefore to their lower propensity to suffer from degradation of the electrode materials, a larger operational temperature window.

The above objective is accomplished by a method and solution according to the present invention.

In a first aspect, the present invention relates to a method for forming a conformal coating on a substrate having a topography presenting a relief, said method comprising the steps of:

a. Setting the temperature of the substrate within the range 140-275° C., and b. coating an aqueous solution comprising a sol-gel (or solution-gel) precursor on said substrate.

Setting the temperature of the substrate within that range turned out to be advantageous as it improved the conformality of the coating.

The substrate may be a porous substrate. Nevertheless, the substrate is preferably not a fibrous porous substrate, in other words a substrate constituted by filaments or fibers such as a metallic wool. Preferably, the substrate may be a non-porous substrate.

In embodiments, the temperature may be at least 140° C., preferably at least 160° C., more preferably at least 170° C., yet more preferably at least 180° C. In these embodiments, the temperature may be at most 275° C., preferably at most 250° C., more preferably at most 220° C., yet more preferably at most 210° C. and most preferably at most 200° C.

For instance, the temperature may be preferably set within the range 160-250° C., more preferably within the range 170-210° C.

In embodiments, the temperature may be preferably set within the range 160-200° C., more preferably within the range 170-190° C.

Particularly good results were obtained within the range 180-200° C.

In embodiments, said aqueous solution may be as specified in any embodiments of the third aspect.

In embodiments, the method may further comprise after step b., a step c. of annealing said coated substrate. The annealing step leads to a good crystallisation of the metal oxide layer corresponding to the precursor. In embodiments, the annealing may be performed by heating up the substrate at a temperature and for a time sufficient to lead to the complete decomposition of the precursor and formation of the metal oxide. For instance, the annealing can be performed by heating the substrate to a temperature of up to from 450° C. to 1100° C. or from 450° C. to 750° C. For instance, the annealing can be performed at 500° C., 600° C., 800° C. or 1000° C. The annealing time may be adapted so that a complete decomposition of the gel is obtained.

In embodiments, said relief may be composed of one or more elements and at least one of said elements may have an aspect ratio of at least 10.

The aspect ratio may typically refer to the ratio between the vertical dimension of extension of that object (e.g. its height in the case of a pillar or its depth in the case of a trench) and the shortest of its horizontal dimensions of extension (i.e. its width).

In embodiments, at least one element of said relief may have the shape of a pillar or of a trench. For instance, the pillar may have a diameter of from 0.5 to 10 µm. The height of each pillar may be for instance from 10 to 200 µm. The average inter-pillar distance may for instance be from 2 to 20 µm, preferably from 3 to 20 µm. The trench may have a width in the range of 0.5 to 10 µm. The depth of the trench may be for instance in range of 10 to 200 µm. The average inter-trench distance may be for instance from 2 to 20 µm, preferably from 3 to 20 µm.

In embodiments, the substrate may be a semiconductor substrate. For instance, it can be Si substrate. A particularly preferred embodiment is a Si substrate presenting a plurality of pillars and/or trenches, preferably a plurality of pillars, as defined in any embodiment of the present invention.

In embodiments, the substrate may be a dielectric substrate or may be a semiconductor substrate having a dielectric oxide surface (e.g. a Si substrate with a $SiO_2$ surface). A particularly preferred embodiment is a Si substrate with a $SiO_2$ surface presenting a plurality of pillars and/or trenches, preferably presenting a plurality of pillars, as defined in any embodiment of the present invention.

In embodiments said substrate may comprise a metal or conductive ceramic surface and the coating of step b. may be performed on that surface. For instance, the substrate can be a Si substrate coated with such a metal or conductive ceramic material. An example of conductive ceramic material is TiN. The thickness of the metal or conductive ceramic material can for instance be from 10 to 30 nm. This is adequate for application in a thin-film battery. The presence of a metal or conductive ceramic material layer on the substrate is advantageous because it can be used as the current collector in a thin-film battery. Furthermore, such a layer may block the diffusion of a metal of the metal oxide (e.g. Li).

In embodiments, the step of coating a solution may be performed with an aerosol of said solution.

In embodiments, the step of coating said solution may be performed by spraying. Spraying leads to much higher conformality than spin coating, soaking, dip coating, drop casting, or air brushing.

In embodiments, said spraying may be performed via an ultrasonic nozzle.

In embodiments, step b. may form a conformal coating of said solution on said substrate. In embodiments, the method may be for forming a conformal coating on a substrate having a topography presenting a relief. The coverage of the substrate by the aqueous precursor is preferably complete. In view of the temperature of the substrate at the time of contact between the aqueous solution and the substrate, a conformal coating is readily achieved. Without being bound by theory, this is believed to be the result of a lowering of the surface tension of the precursor solution on a substrate at that temperature and/or of an early drying and/or decomposition induced at that temperature. This temperature range appears to be ideal in reducing the surface tension of the solution on the substrate, allowing the solution enough time to spread evenly on the substrate but not so much time as to allow gravity to make the coating thicker at the bottom of the relief elements. Also, this temperature range appears to induce a partial drying of the solution before it touches the surface of the substrate, thereby transforming the solution into a gel and even partly decomposing this gel very shortly after it contacts the surface. It is the understanding of the present inventors, in view of the above considerations, that the particular temperature range and the use of an aqueous solution comprising a sol-gel precursor are keys in the obtaining of a conformal coating on a substrate having a topography presenting a relief.

In embodiments the method may further comprise a step, before step b., of cleaning said substrate.

In embodiments, cleaning the substrate may be performed via a dry process. Preferably, the dry process comprises contacting the surface with gaseous ozone in the presence of ultra-violet radiation at 60° C. This is advantageous because it permits to minimize or even avoid chemical residues between the elements of relief (e.g. the pillars and/or the trenches) of the surface. It also improves the wetting of the surface by the precursor solution.

In a second aspect, the present invention relates to a method for fabricating a battery (e.g a thin film battery such as a thin film Li-ion battery or a 3D thin film Li-ion battery), a capacitor (e.g. such as a thin film capacitor), a catalyst, a photovoltaic cell or a sensor, said method comprising a step of forming a conformal coating on a substrate having a topography presenting a relief, according to any one of the previous embodiments of the conformal coating method according to the invention.

In a particular embodiment of the second aspect, the method may relate to fabricating a battery and may comprise the step of forming on a substrate having a topography presenting a relief, at least one conformal layer selected from the group consisting of a cathode layer, an electrolyte layer and an anode layer, wherein said step of forming at least a conformal layer is performed according to any embodiment of the first aspect.

For instance, the present invention may relate to a method for fabricating a battery comprising a step of forming, on a substrate having a topography presenting a relief, the following layers:
a. A cathode layer,
b. An electrolyte layer, and
c. An anode layer,
wherein at least one of these layers (and preferably at least one of the cathode and of the anode layers) is formed on the substrate by coating on the substrate an aqueous solution comprising a sol-gel precursor while the substrate is set at a temperature within the range 140-275° C. (and preferably 140-220° C.).

In a particular embodiment of the second aspect, the method may relate to fabricating a capacitor (e.g. a thin film capacitor) and may comprise the step of forming on a substrate having a topography presenting a relief, a dielectric layer, wherein said step of forming said dielectric layer is performed according to any embodiment of the first aspect.

In embodiments, the substrate and its topography may be according to any embodiments of the first aspect.

In embodiments, the aqueous solution may be according to any embodiments of the third aspect.

In embodiments, the anode layer may be formed on the substrate by coating thereon an aqueous solution comprising a sol-gel precursor of $TiO_2$ or sol-gel precursors of $Li_4Ti_5O_{12}$ or sol-gel precursors of $Li_xWO_3$ with $0 \leq x \leq 1$, preferably of $LiWO_3$.

In embodiments, the electrolyte layer may be formed on the substrate by coating thereon aqueous solution comprising sol-gel precursors of $Li_{3x}La_{(2/3)-x}TiO_3$ with $0.06 \leq x \leq 0.14$, preferably with $0.09 \leq x \leq 0.14$ (e.g. with $x=0.117$).

The molar ratio of the elements constituting the precursor used can be checked by Inductively Coupled Plasma Atomic Emission Spectroscopy (ICP-AES).

In embodiments, the dielectric layer in a thin film capacitor may be formed on the substrate by coating thereon aqueous solution comprising sol-gel precursors of $LuFeO_3$.

In a third aspect, the present invention relates to an aqueous solution suitable for use in the method of the first or of the second aspect, comprising:
At least one metal oxide sol-gel precursor, said precursor being a metal carboxylate complex comprising at least a metal selected from the group consisting of Li, Na, K, Mg, Ca, Sr, Ba, Sc, Y, La, Ti, Zr, Hf, V, Nb, Ta, Cr, Mo, W, Mn, Fe, Ru, Co, Ni, Cu, Zn, Al, Ga, In, Sn, Pb, Bi, Ce, Pr, Nd, Sm, Eu, Gd, Tb, Dy, Ho, Er, Tm, Yb and Lu, preferably selected from the group consisting of Li, Mg, La, Ti, Zr, Ta, Cr, Mo, W, Mn, Fe, Ni, Zn, Al, Ga, In, Bi, Nd and Lu, more preferably selected from the group consisting of Li, La, Ti, W, Fe and Lu, and at least an anion selected from the group consisting of citrate, glycolate, malate, lactate, tartrate, acetate and oxalate, preferably selected from the group consisting of citrate, glycolate and lactate, and A solvent which is water-miscible and suitable for lowering the surface tension of water, whereby the solvent to water volumetric ratio is such as to set the surface tension of a mixture of water with said solvent in said ratio below 40 mN/m, preferably below 35 mN/m, more preferably below 30 mN/m at 25° C.

During the studies leading to the present invention, the inventors have noticed that the presence of such a solvent in such an amount improves even further the uniformity of the coating. Without being bound by theory, this increase in conformality is believed to be due to the lowered surface tension of the aqueous solution, permitting the more rapid spread of the coating in all directions on the substrate before that it fixes on the substrate and before that gravity has the time to reduce much the uniformity of the coating.

In embodiments, said solvent may be an alcohol. Alcohols are usually suitable for decreasing the surface tension of water.

In embodiments, said alcohol may be ethanol. Ethanol has been demonstratively effective in embodiments of the present invention for adapting the composition of the precursor solution so as to improve its ability to form a conformal coating on a substrate having a topology.

In embodiments, the volumetric solvent to water ratio may be from 0.7:1.0 to 1.5:1.0, preferably from 0.7:1.0 to 1.1:1.0 and more preferably from 0.8:1.0 to 1.0:1.0. In a particularly preferred embodiment, the solvent may be an alcohol (e.g. ethanol) and the volumetric alcohol to water ratio may be from 0.7:1.0 to 1.5:1.0, preferably from 0.7:1.0 to 1.1:1.0 or 0.8:1.0 to 1.0:1.0.

In embodiments, the metal oxide sol-gel precursor may comprise at least as metal a metal selected from the group consisting of Ti, Li, Fe, W, La and Lu.

By metal oxide sol-gel precursor, it is meant a sol-gel precursor of a metal oxide. More precisely, said sol-gel precursor of metal oxide is used for the deposition of said metal oxide.

In embodiments, the metal oxide obtained may comprise a single metal or more than one metal in its composition. In embodiments, the metal oxide obtained may comprise Ti as a metal. For instance, the metal oxide obtained may be $TiO_2$, $Li_4Ti_5O_{12}$ or $Li_{3x}La_{(2/3)-x}TiO_3$ with $0.06 \leq x \leq 0.14$, preferably with $x=0.117$. In embodiments, if the metal oxide obtained is $TiO_2$, its crystalline phase may be a mixture of anatase and rutile. Such a mixture is promoted by the use of a high annealing temperature comprised in the range 560-640° C. In another embodiment, it can be pure anatase. Pure anatase is promoted by the use of a lower annealing temperature comprised in the range 460-540° C.

In embodiments, the metal oxide obtained may comprise tungsten as metal. For instance, the metal oxide obtained may be $Li_xWO_3$ with $0 \leq x \leq 1$, preferably $LiWO_3$. In other embodiments, the metal oxide obtained may comprise Fe or/and Lu as metal. For example, the metal oxide obtained may be $LuFeO_3$.

In embodiments, said metal oxide sol-gel precursor may be a citrate metal precursor, in other words a metal citrate complex, such as for instance a citrato-peroxo metal precursor.

A citrato-peroxo metal precursor is for instance obtainable from the reaction of an alkoxide of the metal with water to form an hydrolysis product and from the reaction of that hydrolysis product with hydrogen peroxide and citric acid. If more than one metal is wished in the composition of the metal oxide, various mono-metal ion precursors can be mixed in the appropriate ratio.

In embodiments, a citrato-peroxo metal precursor may be obtained as follow: First, a metal containing starting material (e.g. an alkoxide of the metal) is hydrolysed with water. Second the hydrolysis product is contacted with a mixture of citric acid and hydrogen peroxide in such a way as to form a clear solution. Third, the pH of the solution is neutralized. The solution is then typically further diluted before coating (e.g. spraying).

In the first step, the amount of metal containing starting material may be adapted so that the metal concentration in the citrato-peroxo metal precursor solution obtained after the third step is from 0.05 to 2 mol/l, preferably from 0.1 to 1 mol/l. After the third step, when the solution is diluted prior to coating (e.g. spraying), this final dilution may have a metal concentration of from 0.01 to 0.05 mol/l. Preferably, the solution is diluted with ethanol prior to coating.

In the second step, the citric acid can for instance be in a molar ratio of from 1:1 to 3:1 with respect to the metal, preferably from 2:1 to 3:1 with respect to the metal. The hydrogen peroxide can also be for instance in a molar ratio of 1:1 to 3:1 with respect to the metal. Preferably, the citric acid and the hydrogen peroxide are in a molar ratio of 1:0.4 to 1:0.6 toward each other. In embodiments, both the hydrogen peroxide and the citric acid are each in a molar ratio of from 1.5:1 to 2.5:1 more preferably from 1.8:1 to 2.2:1, yet more preferably 1.9:1 to 2.1:1 with respect to the metal. After contacting of the hydrolysis product with the mixture (end of second step), the resulting second mixture may be stirred at a temperature comprised between 30° C. and 90° C. for a time sufficient to lead to a clear solution. A base (typically ammonia) may then be added slowly to the clear solution until a neutral pH is obtained.

In other embodiments, said metal oxide sol-gel precursor may be a citrate metal precursor, in other words a metal citrate complex, said metal being selected from the group consisting of Sc, Y, La, Mn, Zn, Ce, Pr, Nd, Sm, Eu, Gd, Tb, Dy, Ho, Er, Tm, Yb and Lu, preferably from the group consisting of Li, W, Fe, La and Lu.

A citrate tungsten precursor is for instance obtainable from the complexation reaction of tungstic acid with citric acid. A citrate metal complex of a metal selected from the group consisting of Sc, Y, La, Mn, Zn, Ce, Pr, Nd, Sm, Eu, Gd, Tb, Dy, Ho, Er, Tm, Yb and Lu may be obtained by complexation reaction of an oxide of said metal with citric acid. Particularly, a citrate La complex or a citrate Lu complex may be obtained by complexation reaction of La (III) oxide or Lu (III) oxide with citric acid. In all cases, if more than one metal is wished in the composition of the metal oxide, various mono-metal ion precursors can be mixed in the appropriate ratio.

In embodiments, a citrate tungsten precursor may be obtained as follow: First, tungstic acid, citric acid and water are mixed together, the molar ratio $W^{6+}$: citric acid being in the range of from 1:1: to 1:6, preferably equal to 1:4. Second, the mixture obtained is refluxed at a temperature comprised in the range of from room temperature to 120° C., preferably at 120° C. during 2 minutes to 24 H, preferably during 24 H, and then cooled. Third, the pH of the solution is increased up to pH 11, preferably up to pH 12, by addition of a base (typically ammonia). Fourth, the solution obtained in the third step is then refluxed at a temperature comprised in the range of from room temperature to 120° C., preferably at 110° C., during 2 minutes to 24H, preferably during 24 H. Fifth, the solution obtained in step four is diluted with water thereby obtaining solution having a pH from 7 to 8, preferably equal to 8, and a $[W^{6+}]$ lower than or equal to 0.5 M, preferably equal to 0.15 M. Sixth, the solution obtained in step five is diluted prior to coating (e.g. spraying), this final dilution may have a total metal concentration of from 0.01 to 0.05 M. Preferably, the solvent used for the dilution prior to coating is ethanol.

In embodiments, a citrate La or Lu precursor may be obtained as follow: First, La or Lu oxide, citric acid and water are mixed together, the molar ratio $Lu^{3+}$: citric acid or $La^{3+}$: citric acid being comprised between 1:1 to 1:6, preferably being respectively equal to 1:1 or to 1:3. Second, the mixture obtained is refluxed at a temperature comprised between room temperature and 120° C., preferably at 120° C., during 2 minutes to 24 H, preferably during 24 H, and then cooled. Third, the pH of the solution is respectively increased up to pH 11 or up to pH 12 by addition of a base (typically ammonia). Fourth, the solution obtained in the third step is then refluxed at a temperature comprised between room temperature to 120° C., preferably at 110° C. or at 120° C., during 2 minutes to 24 H, preferably during 24 H. Fifth, the solution obtained in step four is diluted with water thereby obtaining solution having a pH comprised in the range of pH 7 to 8, preferably respectively equal to 7.5 or 8 and a $[Lu^{3+}]$ or $[La^{3+}]$ lower than or equal to 0.5 M, preferably respectively equal to 0.1 M or 0.075 M. Sixth, the solution obtained in step five is diluted prior to coating (e.g. spraying), this final dilution may have a total metal concentration of from 0.01 to 0.05 M. Preferably, the solvent used for the dilution prior to coating is ethanol.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

EXAMPLE 1

Synthesis of a Citrato-peroxo Titanium Precursor

The starting product was liquid Ti(IV)isopropoxide (Ti(OiPr)$_4$, Acros organics, 98+%). The appropriate amount of Ti(IV)isopropoxide to obtain a 0.73 mol/L solution was added to a tenfold volume of water, leading to immediate hydrolysis and condensation and finally to the formation of a white precipitate. This precipitate was filtered and washed with water. The hydrolysis product was processed quickly in order to avoid it becoming insoluble. In a next step, citric acid (CA, $C_6H_8O_7$, Sigma-Aldrich, 99%) and hydrogen peroxide ($H_2O_2$, stabilized, Acros, 35% p.a aqueous solution) were added to the fresh, wet precipitate, so that the molar ratio $Ti^{4+}:CA:H_2O_2$ was 1:2:1.2. The mixture was then stirred at 80° C., which after a short time yielded a clear, burgundy coloured solution, with a pH of about 1. The solution was cooled to room temperature and in the third step, ammonia ($NH_3$, Merck, 32% aqueous solution, extra pure) was added dropwise to the solution in order to increase the pH (pH electrode, WTW inoLab 740 with Sentix 81 electrode). This was accompanied by intense gas evolution and an increase of the solution's temperature. The solution was again cooled to room temperature and its pH was set to exactly 7. During the third step, the solution's colour changed from burgundy (pH=1) to yellow-orange (pH=7). In the last step, the precursor was diluted with $H_2O$ and at the same time ethanol was added so that the $Ti^{4+}$-concentration and the volumetric ethanol:water ratio were, respectively, 0.05 M and 0.9:1.

EXAMPLE 2

Conformal $TiO_2$ Coating of Si Micropillars

Figure 1A:
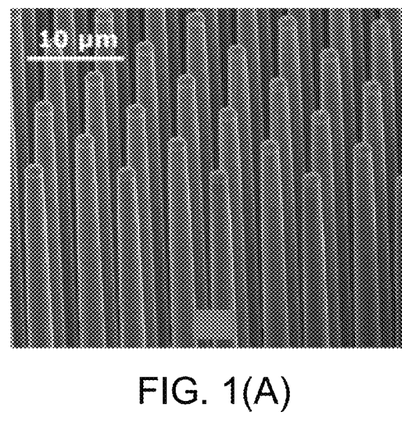
FIGS. 1(A), 1(B), 1(C) and 1(D) are SEM pictures of Si micropillars with 20 nm TiN coating before application of the method of the present invention.
Figure 1B:
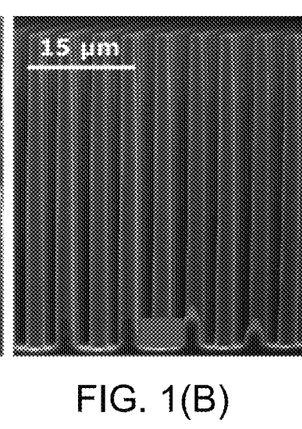
Figure 1C:
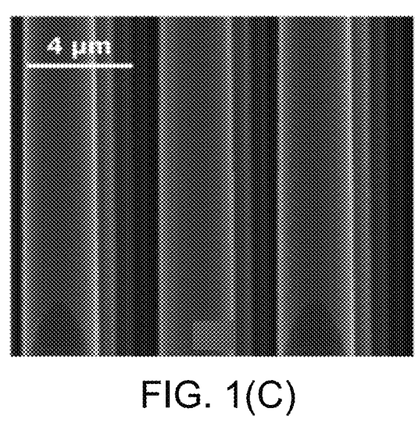
Figure 1D:
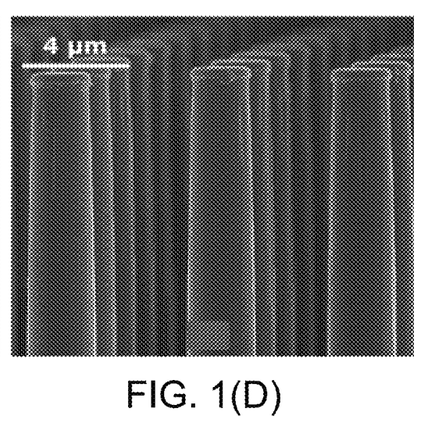
Figure 2A:
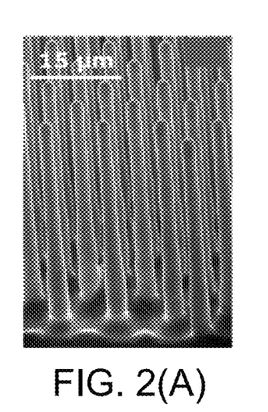
FIGS. 2(A), 2(B) and 2(C) are SEM pictures of the micropillars of FIGS. 1(A), 1(B), 1(C) and 1(D) after conformal Ti coating according to an embodiment of the present invention, before the subsequent heat treatment.
Figure 2B:
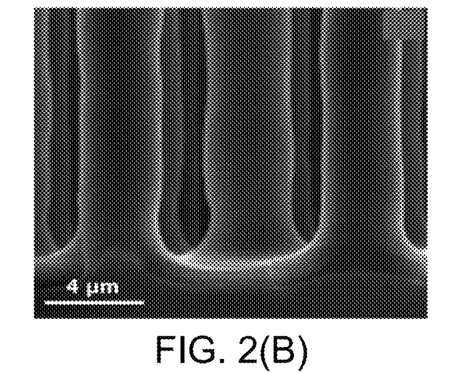
Figure 2C:
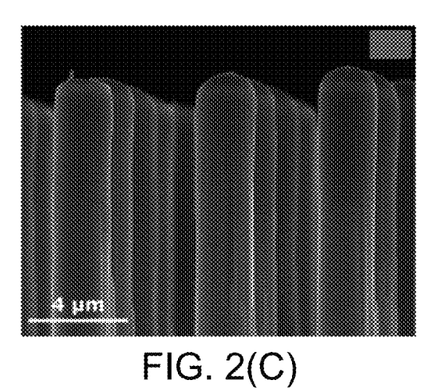

Silicon micropillars have been used as high surface area 3D substrate. In view of their application as substrate in a thin-film battery, the Si micropillars were coated with a thin layer of TiN (ca. 20 nm). This layer is not only used as the current collector in the final battery stack, it also acts as blocking layer for Li. FIGS. 1(A), 1(B), 1(C) and 1(D) are SEM images of Si micropillars with 20 nm TiN coating (prior to the conformal coating with the aqueous solution of example 1): FIG. 1(A) shows a 45° tilted view, FIG. 1(B) shows a view of the pillars, FIG. 1(C) shows a view of the bottom of the pillars and FIG. 1(D) shows a view of the top of the pillars. As can be deducted from the SEM images in FIGS. 1(A), 1(B), 1(C) and 1(D), the pillars have a diameter of ca. 1.85-2.85 μm (dependent on the height along the pillar on which the measurement is performed). They are about 50 μm in height and are positioned 5 μm from each other (interpillar distance). The aspect ratio of the silicon pillars is estimated to be 17-27, dependent on the diameter used for the calculation. If the diameter is averaged over the length of the pillars, the aspect ratio is about 22. The substrate comprising the silicon micropillars was cleaned by a UV/$O_3$ process. The deposition of the precursor on the pillars was performed via spray coating of the solution of example 1 on the substrate set at a temperature of 180° C. in a Exacta-Coat™ ultrasonic coating system. The nozzle was a AccuMist™ precision ultrasonic spray nozzle. Conformal coverage of the silicon pillars with the Ti precursor could be obtained. The resulting gel is shown in the SEM images of the pillars after deposition (FIGS. 2(A), 2(B), and 2(C)). FIGS. 2(A), 2(B) and 2(C) are SEM images of the Si micropillars coated with 20 nm TiN, covered by a gel, consisting of coordinated Ti complexes: FIG. 2(A) shows a 45° tilted view of the pillars, FIG. 2(B) shows a view of the bottom of the pillars and FIG. 2(C) shows the top of the pillars. Thinner $TiO_2$ layers were also prepared and showed even better conformality but these layers were more difficult to be distinguished on the SEM images.

Figure 3A:
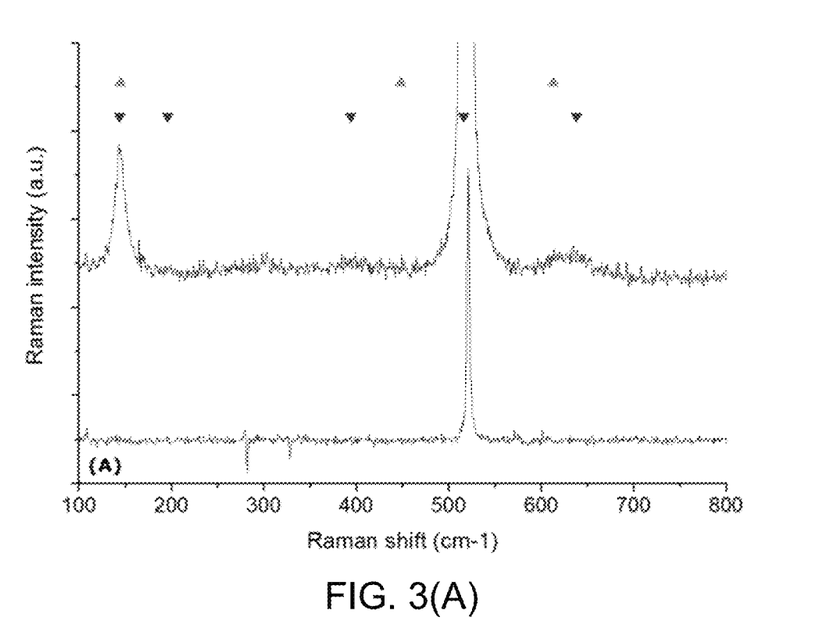
FIG. 3(A) is graph of the Raman spectrum of the top of a pillar before (bottom) and after (top) conformal coating according to an embodiment of the present invention. As a reference the Raman signals for anatase (▼) and rutile (▲) are shown.
Figure 3B:
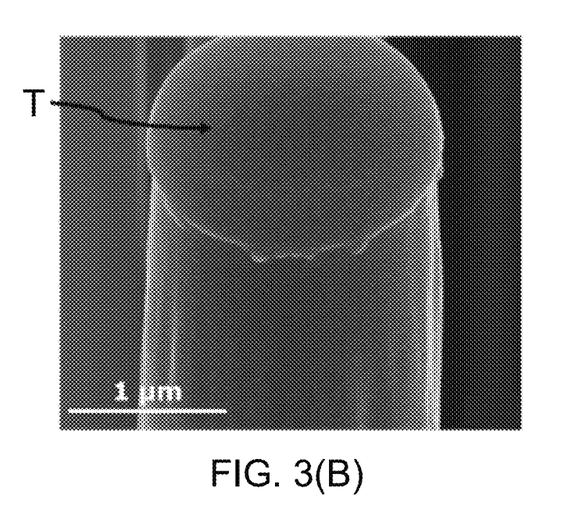
FIG. 3(B) is a picture of the top of the pillar after the conformal coating.
Figure 4:
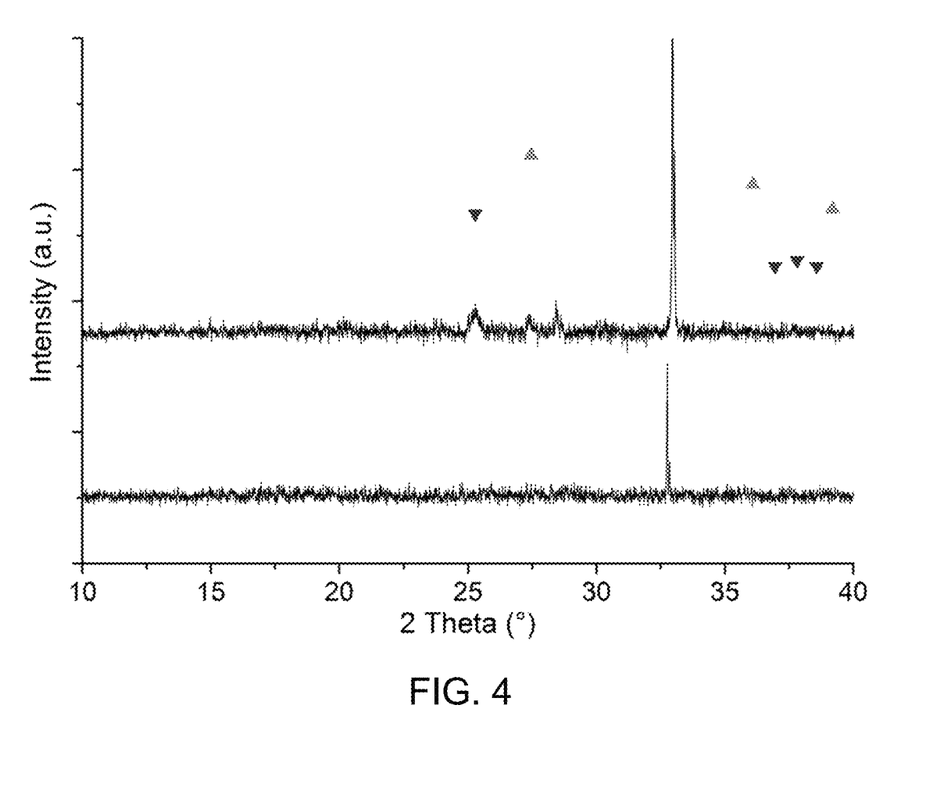
FIG. 4 shows the XRD patterns of pillars before (bottom) and after (top) conformal coating according to an embodiment of the present invention. As a reference the XRD signals for anatase (▼) and rutile (▲) are shown.

Further heat treatment of the pillars on hot plates at first 180° C. (2 min), then 300° C. (2 min) and finally at 600° C. (60 min) lead to the decomposition of the gel and thus to $TiO_2$ oxide formation. It also triggered the crystallisation of the deposited layer. The morphology change, related to the crystallisation process (SEM image of FIG. 3(B)), and the accompanying Raman spectrum (See FIG. 3(A) top spectrum) can be observed in FIGS. 3(A) and 3(B). It is clear that the $TiO_2$ layer had been crystallised as a mixture of anatase (bottom pointing triangles) and rutile (top pointing triangles). Further proof of the presence of the phase mixture can be found in the XRD pattern in FIG. 4 (top pattern). A more thorough crystallisation study on planar substrates indicated that phase-pure anatase films could be obtained by lowering the final anneal temperature to 500° C. (data not shown).

EXAMPLE 3

Synthesis of a Citrato-peroxo Titanium-lithium Precursor

First, the mono-metal Ti (IV) and Li (I) ion solutions were prepared separately.

For the Ti (IV) precursor, the starting product was liquid Ti(IV)isopropoxide (Ti(OiPr)$_4$, Acros organics, 98+%). The appropriate amount of Ti(IV)isopropoxide to obtain a 0.73 mol/l solution was added to a tenfold volume of water, leading to immediate hydrolysis and condensation and finally to the formation of a white precipitate. This precipitate was filtered and washed with water. The hydrolysis product was processed quickly in order to avoid it becoming insoluble. In a next step, citric acid (CA, $C_6H_8O_7$, Sigma-Aldrich, 99%) and hydrogen peroxide ($H_2O_2$, stabilized, Acros, 35% p.a aqueous solution) were added to the fresh, wet precipitate, so that the molar ratio $Ti^{4+}:CA:H_2O_2$ was 1:2:1.2. The mixture was then stirred at 80° C., which after a short time yielded a clear, burgundy coloured solution, with a pH of about 1. The solution was cooled to room temperature and in the third step, ammonia ($NH_3$, Merck, 32% aqueous solution, extra pure) was added dropwise to the solution in order to increase the pH (pH electrode, WTW inoLab 740 with Sentix 81 electrode). This was accompanied by intense gas evolution and an increase of the solution's temperature. The solution was again cooled to room temperature and its pH was set to exactly 7. During the third step, the solution's colour changed from burgundy (pH=1) to yellow-orange (pH=7).

For the Li (I) precursor, lithium hydroxide (LiOH, Sigma-Aldrich, ≥98%) and citric acid (CA, $C_6H_8O_7$, Sigma-Aldrich, 99%) were added in water so that the final Li (I) ion concentration and $Li^+$:CA ratio were, respectively, 0.7 M and 1:1. Then, the mixture was stirred at 80° C., which after a short time yielded a clear, colourless solution, with a pH of about 3.5. The solution was cooled to room temperature and in the third step, ammonia ($NH_3$, Merck, 32% aqueous solution, extra pure) was added dropwise to the solution in order to increase the pH (pH electrode, WTW inoLab 740 with Sentix 81 electrode). This was accompanied by an increase of the solution's temperature. The solution was again cooled to room temperature and its pH was set to exactly 7.

The multi-metal ion Ti/Li precursor was then prepared by mixing the Ti (IV) and Li (I) solutions in the desired amounts (molar ratio=5:4). Water and ethanol were added to the solution so that the total metal ion concentration and the volumetric ethanol:water ratio were set at, respectively, 0.05 M and 0.9:1.

EXAMPLE 4

Conformal $Li_4Ti_5O_{12}$ Coating of Si Micropillars.

Figure 5A:
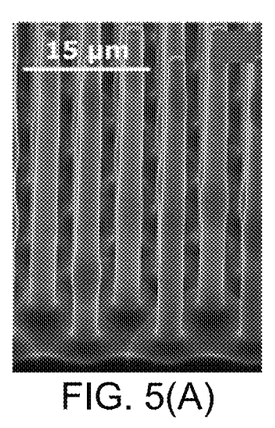
FIGS. 5(A), 5(B) and 5(C) are SEM pictures of the micropillars of FIGS. 1(A), 1(B), 1(C) and 1(D) after conformal Ti, Li coating according to an embodiment of the present invention, before the subsequent heat treatment.
Figure 5B:
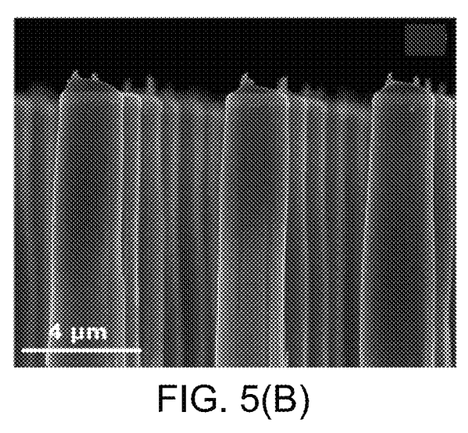
Figure 5C:
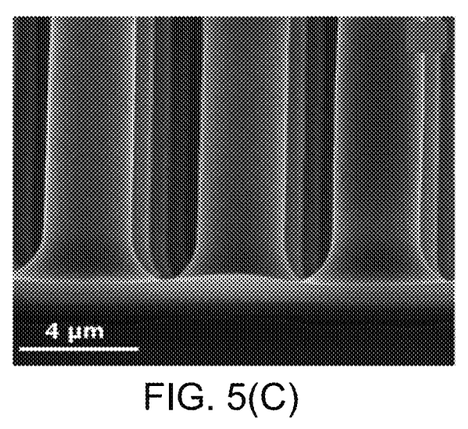

Example 2 was repeated except that the aqueous solution of example 3 was used instead of the aqueous solution of example 1 and that the further treatment (for decomposition of the gel) of the pillars on hot plates was performed at first 260° C. (2 min), and then 470° C. (2 min). Spray coating of the optimised precursor on Si micropillars, coated with TiN, lead to a complete coverage of the pillars with the precursor. This can be observed in the SEM images in FIGS. 5(A), 5(B) and 5(C), where the gel formation is clearly visible. FIGS. 5(A), 5(B) and 5(C) are SEM images of Si micropillars, coated with 20 nm TiN, covered by a gel, consisting of coordinated Li, Ti complexes obtained by spraying the solution of example 3 thereon. FIG. 5(A) is a 45° tilted view of the pillars, FIG. 5(B) shows the top of the pillars, and FIG. 5(C) shows the bottom of the pillars.

Further heat treatment of the pillars lead to the decomposition of the gel and thus to Li, Ti oxide formation. It also triggered the crystallisation of the deposited layer. The same experiment was repeated on a planar $Si_3N_4$ surface and on a Pt surface in order to enable an easier crystallisation study of the $Li_xTi_yO_z$ films. It showed that phase-pure $Li_4Ti_5O_{12}$ (spinel phase) could be achieved.

EXAMPLE 5

Synthesis of a Citrato Lithium-lanthanum-titanium Precursor

First, the mono-metal Li (I), La (III) and Ti (IV) ion solutions were prepared separately.

For the Li (I) precursor, lithium citrate hydrate ($C_3H_5OH(COOLi)_3 \cdot xH_2O$, Sigma Aldrich, ≥99%) was added to water, yielding a clear, colorless solution with a $Li^+$-ion concentration 1 M and pH 8 (pH electrode, WTW inoLab 740 with Sentix 81 electrode).

For the La (III) precursor, lanthanum oxide ($La_2O_3$, Alfa Aesar, 99.9%) and citric acid hydrate (CA, $C_6H_8O_7 \cdot H_2O$, Sigma-Aldrich, ≥99%) were added to a minimum of water so that the final $La^{3+}$:CA ratio was 1:3. The mixture was refluxed at 120° C. for 24 h, after which it was cooled to room temperature and in the next step, ammonia ($NH_3$, Merck, 32% aqueous solution, extra pure) was added dropwise to the solution in order to increase the pH to 12 (pH electrode, WTW inoLab 740 with Sentix 81 electrode). Then, the whole was refluxed at 110° C. for 24 h and water was added, yielding a clear, yellowish 0.075 M solution with a pH of 8.

For the Ti (IV) precursor, the starting product was liquid Ti(IV)isopropoxide ($Ti(OiPr)_4$, Sigma-Aldrich, ≥97%). The appropriate amount of Ti(IV)isopropoxide to obtain a 0.9 mol/l solution was added to a tenfold volume of water, leading to immediate hydrolysis and condensation and finally to the formation of a white precipitate. This precipitate was filtered and washed with water. The hydrolysis product was processed quickly in order to avoid it becoming insoluble. In a next step, citric acid (CA, $C_6H_8O_7$, Sigma-Aldrich, 99%) and hydrogen peroxide ($H_2O_2$, stabilized, Acros, 35% p.a aqueous solution) were added to the fresh, wet precipitate, so that the molar ratio $Ti^{4+}$:CA:$H_2O_2$ was 1:3:1.2. The mixture was then stirred at 80° C., which after a short time yielded a clear, burgundy coloured solution, with a pH of about 1. The solution was cooled to room temperature and in the third step, ammonia ($NH_3$, Merck, 32% aqueous solution, extra pure) was added dropwise to the solution in order to increase the pH (pH electrode, WTW inoLab 740 with Sentix 81 electrode). This was accompanied by intense gas evolution and an increase of the solution's temperature. The solution was again cooled to room temperature and its pH was set to exactly 7. During the third step, the solution's colour changed from burgundy (pH=1) to yellow-orange (pH=7).

The multi-metal ion Li/La/Ti precursor was then prepared by mixing the Li (I), La (III) and Ti (IV) solutions in the desired amounts (molar ratio=0.35:0.55:1). Water and ethanol were added to the solution so that the total metal ion concentration and the volumetric ethanol:water ratio were set at, respectively, 0.01 M and 0.9:1.

EXAMPLE 6

Conformal $Li_{3x}La_{(2/3)-x}TiO_3$ x=0.117 Coating of Si Micropillars

Figure 6A:
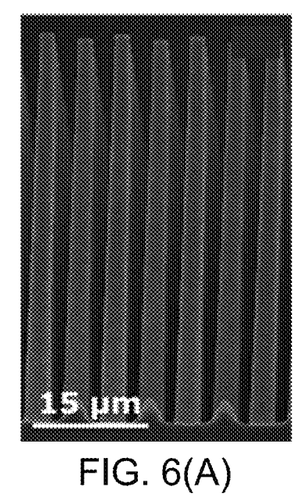
FIGS. 6(A), 6(B), 6(C) and 6(D) are SEM pictures of the micropillars of FIGS. 1(A), 1(B), 1(C) and 1(D) after conformal $Li_{3x}La_{(2/3)-x}TiO_3$ with x=0.117 coating according to an embodiment of the present invention, after the subsequent heat treatment.
Figure 6B:
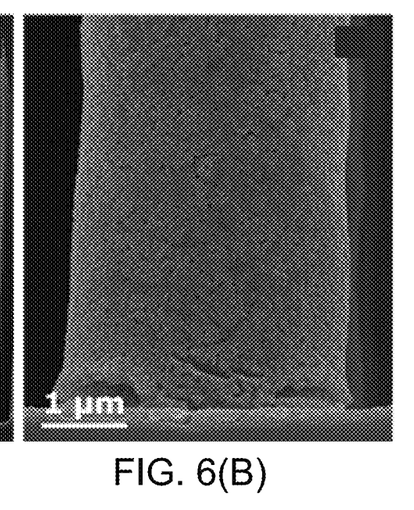
Figure 6C:
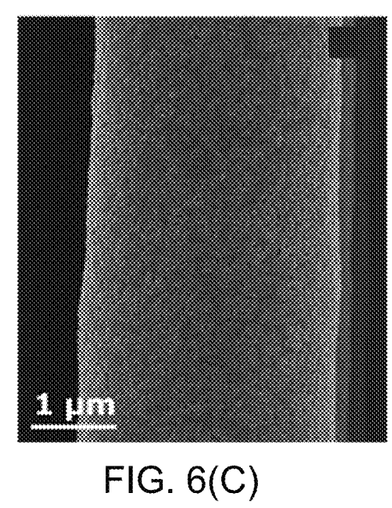
Figure 6D:
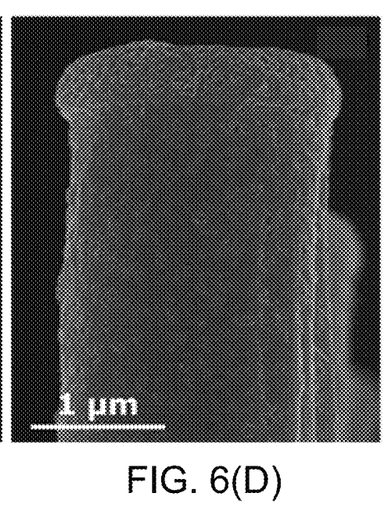

Example 2 was repeated except that the aqueous solution of example 5 was used instead of the aqueous solution of example 1, that the substrate was set at a temperature of 200° C. instead of 180° C. and that the further treatment of the pillars on hot plates was performed at first 180° C. (2 min), then 300° C. (2 min), then 600° C. (2 min), and finally 700° C. (60 min in a furnace). Spray coating of the optimised precursor on Si micropillars, coated with TiN, and subsequent annealing in order to decompose the precursor and trigger the Li/La/Ti oxide formation lead to a complete coverage of the pillars. This can be observed in the SEM images in FIGS. 6(A), 6(B), 6(C) and 6(D), where the complete coating is visible. FIGS. 6(A), 6(B), 6(C) and 6(D) are SEM images of Si micropillars, coated with 20 nm TiN, covered by $Li_{3x}La_{(2/3)-x}TiO_3$ (x=0.117), obtained by spraying the solution of example 5 thereon. FIG. 6(A) is an overview of the pillars, FIG. 6(B) shows the bottom of the pillars, FIG. 6(C) the middle and FIG. 6(D) shows the top of the pillars. Furthermore, it was shown that a crystalline coating could be achieved.

EXAMPLE 7

Synthesis of a Citrato Lithium-tungsten Precursor

First, the mono-metal Li (I) and W (VI) ion solutions were prepared separately.

For the Li (I) precursor, lithium citrate hydrate ($C_3H_5OH(COOLi)_3 \cdot xH_2O$, Sigma Aldrich, ≥99%) was added to water, yielding a clear, colorless solution with a $Li^+$-ion concentration 1 M and pH 8 (pH electrode, WTW inoLab 740 with Sentix 81 electrode).

For the W (VI) precursor, tungstic acid ($H_2WO_4$, Sigma Aldrich, ≥99% and citric acid hydrate (CA, $C_6H_8O_7 \cdot H_2O$, Sigma-Aldrich, ≥99%) were added to a minimum of water so that the final $W^{6+}$:CA ratio was 1:4. The mixture was refluxed at 120° C. for 24 h, after which it was cooled to room temperature and in the next step, ammonia ($NH_3$, Merck, 32% aqueous solution, extra pure) was added dropwise to the solution in order to increase the pH to 12 (pH electrode, WTW inoLab 740 with Sentix 81 electrode).

Then, the whole was refluxed at 110° C. for 24 h and water was added, yielding a clear, slightly grey colored 0.15 M solution with a pH of 8.

The multi-metal ion Li/W precursor was then prepared by mixing the Li (I) and W (VI) solutions in the desired amounts (molar ratio=1:1). Water and ethanol were added to the solution so that the total metal ion concentration and the volumetric ethanol:water ratio were set at, respectively, 0.01 M and 0.9:1.

EXAMPLE 8

Conformal LiWO$_3$ Coating of Si Micropillars

Figure 7A:
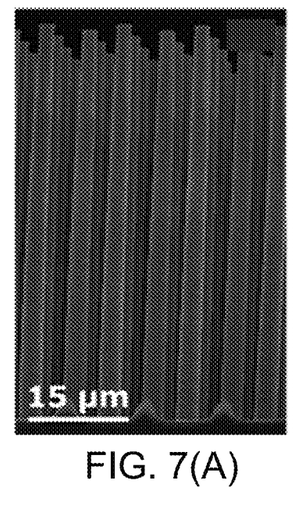
FIGS. 7(A), 7(B), 7(C) and 7(D) are SEM pictures of the micropillars of FIGS. 1(A), 1(B), 1(C) and 1(D) after conformal $LiWO_3$ conformal coating according to an embodiment of the present invention, after the subsequent heat treatment.
Figure 7B:
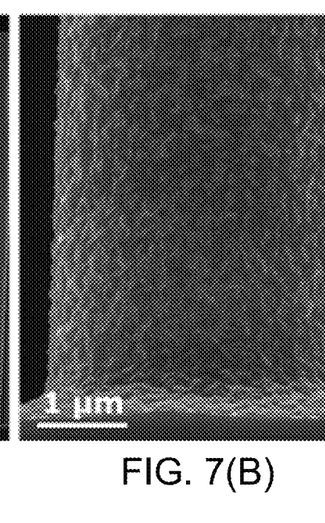
Figure 7C:
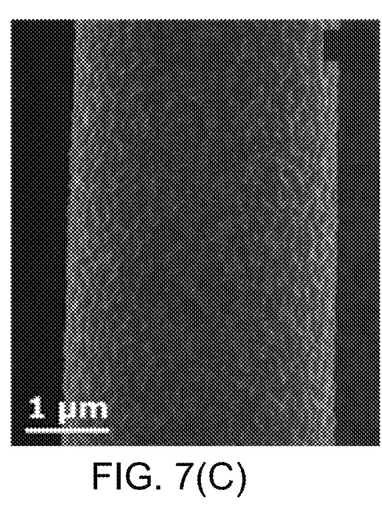
Figure 7D:
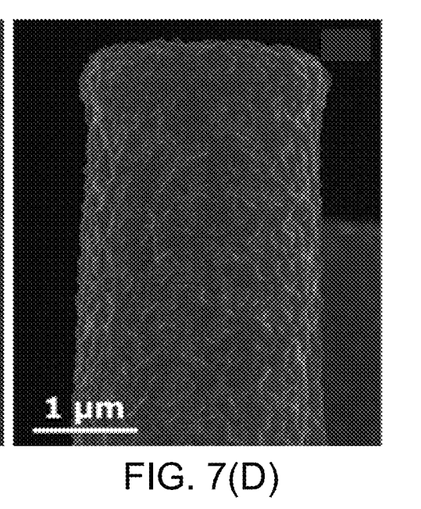

Example 2 was repeated except that the aqueous solution of example 7 was used instead of the aqueous solution of example 1, that the substrate was set at a temperature of 200° C. instead of 180° C. and that the further treatment of the pillars on hot plates was performed at first 180° C. (2 min), then 300° C. (2 min), then 600° C. (2 min), and finally 700° C. (60 min in a furnace). Spray coating of the optimised precursor on Si micropillars, coated with TiN, and subsequent annealing on hot plates in order to decompose the precursor and trigger the Li/W oxide formation lead to a complete coverage of the pillars. This can be observed in the SEM images in FIGS. 7(A), 7(B), 7(C) and 7(D), where the complete coating is visible. FIGS. 7(A), 7(B), 7(C) and 7(D) re SEM images of Si micropillars, coated with 20 nm TiN, covered with the aforementioned oxide, obtained by spraying the solution of example 7 thereon. FIG. 7(A) is an overview of the pillars, FIG. 7(B) shows the bottom of the pillars, FIG. 7(C) the middle and FIG. 7(D) shows the top of the pillars.

EXAMPLE 9

Synthesis of a Citrato Lutetium-iron Precursor

First, the mono-metal Lu (III) and Fe (III) ion solutions were prepared separately.

For the Lu (III) precursor, lutetium (III) oxide (Lu$_2$O$_3$, Alfa Aesar, 99.9%) and citric acid (CA, C$_6$H$_8$O$_7$, Sigma-Aldrich, 99%) were added to a minimum of water so that the final Lu$^{3+}$:CA ratio was 1:1. The mixture was refluxed at 120° C. for 24 h, after which it was cooled to room temperature and in the next step, ammonia (NH$_3$, Merck, 32% aqueous solution, extra pure) was added dropwise to the solution in order to increase the pH to 11 (pH electrode, WTW inoLab 740 with Sentix 81 electrode). Then, the whole was refluxed at 110° C. for 24 h and water was added, yielding a clear, colorless 0.1 M solution with a pH of 7.5.

For the Fe (III) precursor, iron (III) citrate hydrate (FeC$_6$H$_5$O$_7$.H$_2$O, Acros, 98%, 18-20% Fe) was added in water so that the final Fe (III) ion concentration was 0.1 M. Then, the mixture was stirred at 80° C. overnight, which yielded a clear, brown solution with a pH of about 1.5. The solution was cooled to room temperature and in the next step, ammonia (NH$_3$, Merck, 32% aqueous solution, extra pure) was added dropwise to the solution in order to increase the pH to 7 (pH electrode, WTW inoLab 740 with Sentix 81 electrode).

The multi-metal ion Lu/Fe precursor was then prepared by mixing the Lu (III) and Fe (III) solutions in the desired amounts (molar ratio=1:1). Water and ethanol were added to the solution so that the total metal ion concentration and the volumetric ethanol:water ratio were set at, respectively, 0.01 M and 0.9:1.

EXAMPLE 10

Conformal LuFeO$_3$ Coating of Si Micropillars

Figure 8A:
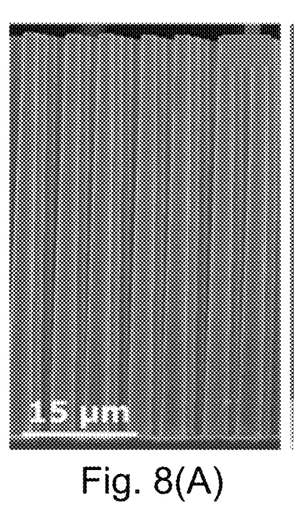
FIGS. 8(A), 8(B), 8(C) and 8(D) are SEM pictures of the micropillars of FIGS. 1(A), 1(B), 1(C) and 1(D) after conformal $LuFeO_3$ coating according to an embodiment of the present invention, before the subsequent heat treatment.
Figure 8B:
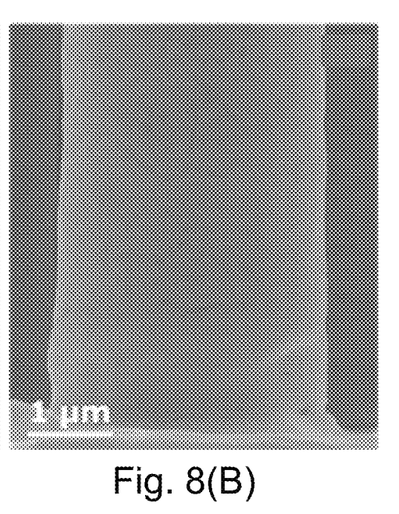
Figure 8C:
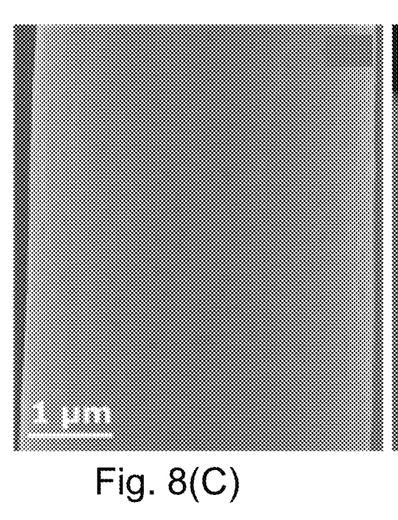
Figure 8D:
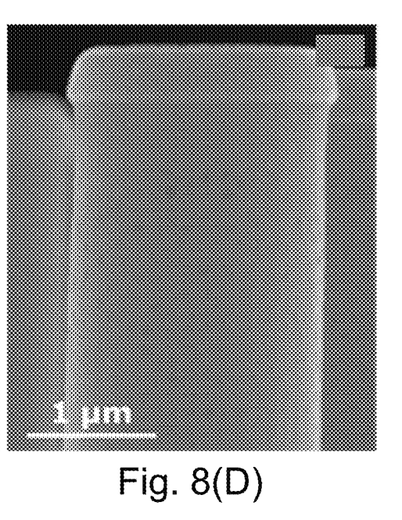

Example 2 was repeated except that the aqueous solution of example 9 was used instead of the aqueous solution of example 1, that the substrate was set at a temperature of 200° C. instead of 180° C. and that the further treatment of the pillars on hot plates was performed at first 320° C. (2 min), then 510° C. (2 min), then 800° C. (60 min in a furnace) or 1000° C. (60 min in a furnace). 800° C. led to a pure hexagonal phase while 1000° C. lead to a pure orthorhombic phase. Spray coating of the optimised precursor on Si micropillars, coated with TiN, and subsequent annealing on hot plates in order to decompose the precursor and trigger the Lu/Fe oxide formation lead to a complete coverage of the pillars. This can be observed in the SEM images in FIGS. 8(A), 8(B), 8(C) and 8(D), where the complete coating is visible. FIGS. 8(A), 8(B), 8(C) and 8(D) are SEM images of Si micropillars, coated with 20 nm TiN, covered with the aforementioned oxide, obtained by spraying the solution of example 9 thereon. FIG. 8(A) is an overview of the pillars, FIG. 8(B) shows the bottom of the pillars, FIG. 8(C) the middle and FIG. 8(D) shows the top of the pillars. Further heat treatment triggered the crystallisation of the deposited layer. The same experiment was repeated on a planar Si$_3$N$_4$ surface and in order to enable an easier crystallisation study of the LuFeO$_3$ films. It showed that both phase-pure hexagonal LuFeO$_3$ and orthorhombic LuFeO$_3$ could be achieved in function of the annealing temperature used.

It is to be understood that although preferred embodiments, specific constructions and configurations, as well as materials, have been discussed herein for devices according to the present invention, various changes or modifications in form and detail may be made without departing from the scope and spirit of this invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:
1. A method for forming a conformal coating on a substrate having a topography presenting a relief, said method comprising:
    setting the temperature of the substrate within the range 140-275° C., and
    coating an aqueous solution comprising a sol-gel precursor on said substrate to form a coated substrate; and
    annealing the coated substrate to provide the conformal coating on the substrate having the topography presenting the relief,
    wherein said relief is composed of a plurality of elements and at least one of said elements has an aspect ratio of at least 10,
wherein the conformal coating is a phase-pure TiO$_2$ anatase film, a lithium titanate film, a lithium lanthanum titanate film, a lithium tungstate film, or a lutetium iron oxide film.
2. The method according to claim 1, wherein said aqueous solution further comprises a solvent which is water-miscible and suitable for lowering the surface tension of water, and wherein the solvent and the water are present in a volumetric ratio such as to set the surface tension of a mixture of water with said solvent in said ratio below 40 mM/m.
3. The method according to claim 1, wherein at least one element of said relief has the shape of a pillar or a trench.

4. The method according to claim 1, wherein the step of coating a solution is performed by spraying.

5. The method according to claim 4, wherein said spraying is performed via an ultrasonic nozzle.

6. The method according to claim 1, further comprising before the coating with the aqueous solution comprising the sol-gel precursor, cleaning said substrate with gaseous ozone in the presence of ultra-violet radiation.

7. A method for fabricating a battery, a capacitor, a catalyst, a photovoltaic cell or a sensor, comprising a step of forming a conformal layer on a substrate having a topography presenting a relief, according to the method as defined in claim 1; and assembling the conformal layer on the substrate into the battery, capacitor, catalyst, photovoltaic cell or sensor.

8. The method according to claim 1, wherein the aqueous solution comprises:
water,
at least one metal oxide sol-gel precursor, said precursor being a metal carboxylate complex comprising at least a metal selected from the group consisting of Ti, Li, Fe, W, La and Lu, and at least an anion selected from the group consisting of citrate, glycolate, malate, lactate, tartrate, oxalate and acetate, and
a solvent which is water-miscible and suitable for lowering the surface tension of water,
wherein the solvent and the water are present in a volumetric ratio such as to set the surface tension of a mixture of water with said solvent in said ratio below 40 mN/m.

9. The method according to claim 8, wherein said solvent is an alcohol.

10. The method according to claim 9, wherein the alcohol is ethanol.

11. The method according to claim 9, wherein the solvent to water ratio is from 0.7:1.0 to 1.5:1.0.

12. The method according to claim 8, wherein said metal oxide sol-gel precursor comprises at least a metal selected from the group consisting of Li, Fe, W, La and Lu.

13. The method according to claim 12, wherein said metal oxide sol gel precursor is a citrate metal precursor.

14. The method according to claim 1, wherein the conformal coating is a phase-pure $TiO_2$ anatase film, a $Li_4Ti_5O_{12}$ spinel film, a $Li_{3x}La_{(2/3)-x}TiO_3$ film, a $Li_xWO_3$ film, a phase-pure hexagonal $LuFeO_3$ film, or a phase-pure orthorhombic $LuFeO_3$ film.

15. The method according to claim 1, wherein the annealing is performed at a temperature of from 450° C. to 1100° C.

16. The method according to claim 1, wherein said aqueous solution further comprises a solvent which is water-miscible and suitable for lowering the surface tension of water, and wherein the solvent and the water are present in a volumetric ratio such as to set the surface tension of a mixture of water with said solvent in said ratio below 30 mN/m at 25° C.

17. The method according to claim 1, wherein the sol-gel precursor is a metal carboxylate complex comprising at least a metal selected from the group consisting of Ti, Li, Fe, W, La and Lu, and at least an anion selected from the group consisting of citrate, glycolate, malate, lactate, tartrate, oxalate and acetate.

18. The method according to claim 1, wherein the solvent is an alcohol and wherein the solvent and the water are present in a volumetric ratio of from 0.7:1.0 to 1.5:1.0.

19. The method according to claim 1, wherein the conformal coating is a film of a lithium titanate, a lithium lanthanum titanate, a lithium tungstate, or a lutetium iron oxide.

20. The method according to claim 19, wherein the conformal coating is a $Li_4Ti_5O_{12}$ spinel film, a $Li_{3x}La_{(2/3)-x}TiO_3$ film, a $Li_xWO_3$ film, a phase-pure hexagonal $LuFeO_3$ film, or a phase-pure orthorhombic $LuFeO_3$ film.

21. The method according to claim 20, wherein the step of coating a solution is performed by spraying and wherein said aqueous solution further comprises a solvent which is water-miscible and suitable for lowering the surface tension of water, and wherein the solvent and the water are present in a volumetric ratio such as to set the surface tension of a mixture of water with said solvent in said ratio below 30 mN/m at 25° C.

22. The method according to claim 1, wherein the conformal coating has a thickness uniformity having a relative standard deviation of less than 5%.

* * * * *